United States Patent
Suzuki et al.

(10) Patent No.: US 6,300,033 B1
(45) Date of Patent: Oct. 9, 2001

(54) POSITIVE PHOTORESIST COMPOSITION AND PROCESS FOR FORMING RESIST PATTERN

(75) Inventors: Takako Suzuki; Kousuke Doi; Hidekatsu Kohara; Toshimasa Nakayama, all of Kanagawa (JP)

(73) Assignee: Tokyo Ohka Kogyo Co., Ltd., Kanagawa (JP)

( * ) Notice: Subject to any disclaimer, the term of this patent is extended or adjusted under 35 U.S.C. 154(b) by 0 days.

(21) Appl. No.: 09/318,601

(22) Filed: May 26, 1999

(30) Foreign Application Priority Data

May 29, 1998 (JP) .................................. 10-149968

(51) Int. Cl.$^7$ ................ G03F 7/023; G03F 7/30
(52) U.S. Cl. ........................ 430/192; 430/191; 430/193; 430/165; 430/326
(58) Field of Search ............... 430/191, 192, 430/193, 326

(56) References Cited

U.S. PATENT DOCUMENTS

| | | | |
|---|---|---|---|
| 4,719,167 | * 1/1988 | Miura et al. | 430/192 |
| 5,407,779 | * 4/1995 | Uetani et al. | 430/192 |
| 5,629,127 | * 5/1997 | Oosedo et al. | 430/191 |
| 5,639,587 | * 6/1997 | Sato et al. | 430/190 |
| 5,726,217 | 3/1998 | Ichikawa et al. | 430/270.1 |
| 5,747,218 | * 5/1998 | Momota et al. | 430/192 |
| 5,912,102 | * 6/1999 | Kawata et al. | 430/191 |

* cited by examiner

Primary Examiner—John S. Chu
(74) Attorney, Agent, or Firm—Wenderoth, Lind & Ponack, L.L.P.

(57) ABSTRACT

In a positive photoresist composition including (A) an alkali-soluble resin and (B) a photosensitizer, Ingredient (B) contains (B-1) a quinonediazide ester of, e.g., bis[2,5-dimethyl-3-(2-hydroxy-5-methylbenzyl)-4-hydroxyphenyl] methane or 2,4-bis[4-hydroxy-3-(4-hydroxybenzyl)-5-methylbenzyl]-6-cyclohexylphenol, and (B-2) a quinonediazide ester of, e.g., methyl gallate or 2,2-bis(2,3,4-trihydroxyphenyl)propane. The composition exhibits high sensitivity and definition, and improved focal depth range properties and underexposure margin.

6 Claims, 5 Drawing Sheets

| | 340ms | 355ms | 370ms | 385ms | 400ms | 415ms | 430ms | 445ms | 460ms | 475ms | 490ms | 505ms | 520ms | 535ms |
|---|---|---|---|---|---|---|---|---|---|---|---|---|---|---|
| -1.0 | | | | | | | | | | | | | | |
| -0.8 | | | | | | | | | 0.452 | | | | | |
| -0.6 | | | | | | | 0.47 | 0.432 | 0.405 | 0.368 | 0.321 | | | |
| -0.4 | | | | | 0.47 | | | | 0.373 | | | 0.31 | | |
| -0.2 | | | | 0.489 | 0.461 | | | 0.386 | | | | 0.32 | | |
| 0 | | | 0.5 | 0.456 | 0.441 | 0.419 | 0.394 | 0.384 | 0.374 | 0.35 | 0.34 | 0.327 | 0.31 | |
| 0.2 | | | | 0.449 | 0.43 | 0.414 | | | | | | | 0.312 | |
| 0.4 | | | | | | | 0.391 | 0.377 | 0.368 | 0.362 | | | 0.313 | |
| 0.6 | | | | | | | | | | 0.371 | 0.347 | 0.33 | | |
| 0.8 | | | | | | | | | | | | | | |
| 1.0 | | | | | | | | | | | | | | |

FIG. 1

| | 340ms | 355ms | 370ms | 385ms | 400ms | 415ms | 430ms | 445ms | 460ms | 475ms | 490ms | 505ms | 520ms | 535ms |
|---|---|---|---|---|---|---|---|---|---|---|---|---|---|---|
| -1.0 | | | | | | | | | | | | | | |
| -0.8 | | | | | | | | | | | | | | |
| -0.6 | | | | | | | 0.47 | 0.432 | 0.405 | 0.368 | 0.321 | | | |
| -0.4 | | | | | | 0.47 | | | 0.373 | | | 0.31 | | |
| -0.2 | | | | 0.489 | 0.461 | | | 0.386 | | | | 0.32 | | |
| 0 | | | 0.5 | 0.456 | 0.441 | 0.419 | 0.394 | 0.384 | 0.374 | 0.35 | 0.34 | 0.327 | 0.31 | |
| 0.2 | | | | 0.449 | 0.43 | 0.414 | | 0.377 | 0.368 | 0.362 | | | 0.312 | |
| 0.4 | | | | | | | 0.391 | | | 0.371 | 0.347 | 0.33 | 0.313 | |
| 0.6 | | | | | | | | | | | | | | |
| 0.8 | | | | | | | | | | | | | | |
| 1.0 | | | | | | | | | | | | | | |

FIG. 2

| | 385ms | 400ms | 415ms | 430ms | 445ms | 460ms | 475ms | 490ms | 505ms | 520ms | 535ms | 550ms | 565ms | 580ms |
|---|---|---|---|---|---|---|---|---|---|---|---|---|---|---|
| -1.0 | | | | | | | | | | | | | | |
| -0.8 | | | | | | | 0.451 | 0.417 | | | | | | |
| -0.6 | | | | | 0.505 | 0.438 | | 0.392 | 0.381 | 0.335 | 0.304 | 0.295 | | |
| -0.4 | | | | 0.469 | | | | | | 0.333 | 0.318 | 0.308 | | |
| -0.2 | | 0.502 | 0.46 | | | | 0.388 | 0.382 | | | | | | |
| 0 | 0.495 | 0.471 | 0.443 | 0.43 | 0.418 | 0.4 | 0.383 | 0.371 | 0.363 | 0.35 | 0.331 | 0.32 | 0.308 | |
| 0.2 | 0.489 | | | | | | | | | | | 0.325 | 0.317 | 0.303 |
| 0.4 | | 0.474 | 0.442 | 0.426 | 0.421 | | | | | | | | 0.318 | 0.309 |
| 0.6 | | | | | 0.414 | 0.406 | 0.381 | 0.372 | 0.367 | 0.354 | 0.342 | 0.325 | 0.318 | 0.308 |
| 0.8 | | | | | | | m | m | m | m | m | m | m | |
| 1.0 | | | | | | | | | | | | | | | m : REDUCTION IN FILM THICKNESS

FIG. 3

| | 340ms | 355ms | 370ms | 385ms | 400ms | 415ms | 430ms | 445ms | 460ms | 475ms | 490ms | 505ms | 520ms | 535ms |
|---|---|---|---|---|---|---|---|---|---|---|---|---|---|---|
| -1.0 | | | | | | | | | | | | | | |
| -0.8 | | | | | | | | | | | | | | |
| -0.6 | | | | | | | | 0.432 | 0.452 | 0.405 | 0.368 | 0.321 | | |
| -0.4 | | | | | | | 0.43 | | 0.373 | | | 0.31 | | |
| -0.2 | | | | | | 0.421 | | 0.386 | | | | 0.32 | | |
| 0 | | | | | | 0.419 | 0.394 | 0.386 | 0.374 | 0.35 | 0.34 | 0.327 | 0.31 | |
| 0.2 | | | | | | 0.414 | | | | | | | 0.312 | |
| 0.4 | | | | | | | 0.398 | 0.388 | 0.368 | 0.362 | | | 0.313 | |
| 0.6 | | | | | | | | | | | 0.347 | 0.33 | | |
| 0.8 | | | | | | | | | | | | | | |
| 1.0 | | | | | | | | | | | | | | |

FIG. 4

| | 325ms | 340ms | 355ms | 370ms | 385ms | 400ms | 415ms | 430ms | 445ms | 460ms | 475ms | 490ms | 505ms | 520ms |
|---|---|---|---|---|---|---|---|---|---|---|---|---|---|---|
| -1.0 | | | | | | | | | | | | | | |
| -0.8 | | | | | | | | | | | | | | |
| -0.6 | | | | | | | | 0.443 | 0.415 | 0.389 | 0.353 | | | |
| -0.4 | | | | | | | 0.472 | | | 0.386 | 0.345 | 0.314 | | |
| -0.2 | | | | | | 0.489 | | | 0.385 | | | 0.314 | | |
| 0 | | | | | | 0.475 | 0.433 | 0.393 | 0.378 | 0.35 | 0.343 | 0.313 | | |
| 0.2 | | | | | | 0.461 | | | | | | 0.322 | 0.299 | |
| 0.4 | | | | | | | 0.435 | 0.411 | 0.388 | 0.371 | | 0.324 | 0.303 | |
| 0.6 | | | | | | | | | | | | 0.321 | 0.308 | |
| 0.8 | | | | | | | | | | | 0.351 | 0.318 | 0.298 | |
| 1.0 | | | | | | | | | | | | | | |

POSITIVE PHOTORESIST COMPOSITION AND PROCESS FOR FORMING RESIST PATTERN

BACKGROUND OF THE INVENTION

1. Field of the Invention

The present invention relates to a positive photoresist composition which exhibits high sensitivity and definition, and improved focal depth range properties and underexposure margin. The term "underexposure margin" used herein means a ratio of Eop/Es, where the exposure to exactly reproduce a pattern in accordance with predetermined dimensions by a mask pattern at an illumination intensity at substrate of 500 mW/cm² is defined as the exposure Eop (ms) and the minimum exposure to give an isolated pattern at an illumination intensity at substrate of 500 mW/cm² is defined as the exposure Es (ms).

2. Description of the Related Art

In the manufacture of ultralarge-scale integrated circuit (Ultra LSI) where a high definition of not more than half amicron, in particular, of not more than 0.35 μm is required, there are demands on photoresist compositions which can form a resist pattern satisfactory in definition, underexposure margin, focal depth range properties and having a good shape.

By way of illustration, Japanese Patent Laid-Open No. 6-167805 discloses a positive photoresist composition containing a quinonediazide ester having a tetra- to hepta-nuclear linear polyphenol skeleton as a photosensitizer. This conventional composition has high definition but remarkably low underexposure margin of 1.0 to 1.2 due to its extremely high γ value, and can hardly form a pattern particularly at positions with low exposures (underexposure side).

In the exposure step, therefore, the formation of a resist pattern is blocked when the exposure is shortened for only several milliseconds relative to the optimum exposure (exposure Eop) or when thickness of a resist film becomes only several hundred nanometers thicker at locations corresponding to steps of a substrate.

In addition, a material containing the aforementioned photosensitizer hardly forms an isolated pattern when the focus of a light source in the exposure step shifts to the plus side (i.e., the light focus is in the substrate side from the resist surface) in the formation of an ultrafine resist pattern of not more than 0.35 μm. FIG. 5 demonstrates changes in the formation of resist patterns with shifts of the focus, where (a) indicates the case using the aforementioned photosensitizer, and (b) indicates the case using another photosensitizer having no tetra- to hepta-nuclear linear skeleton. FIG. 5 demonstrates that the pattern formations in both cases are similar when the focus shifts to the minus side from the zero point where the focus is not shifted, but the use of the aforementioned photosensitizer fails to form any pattern when the focus shifts to the plus side, which is inherent to this photosensitizer.

As a result, the photosensitizer is disadvantageous in that it is narrow in focal depth range and cannot form a resist pattern of the predetermined dimensions when the distance between a light source and a substrate shifts in the exposure step or when a resist film is formed on a stepped substrate and hence the surface of resist film is uneven due to steps of the substrate.

Further, Japanese Patent Laid-Open No. 8-245461 discloses a high-definition positive photoresist composition containing a quinonediazide ester of the specific compound which is disclosed in the present invention as a compound of the formula (Ia) as a photosensitizer, and its Example 1 describes an embodiment using a photosensitizer containing the above quinonediazide ester and a quinonediazide-tetraester of 4-(4-hydroxy-2,5-dimethylbenzyl)pyrogallol.

This composition exhibits high definition but extremely low underexposure margin of 1.0 to 1.2 due to its very high γ value, and can hardly form a pattern particularly at positions with low exposures (underexposure side), as in the above-mentioned Japanese Patent Laid-Open No. 6-167805.

In addition, no isolation pattern is formed when the focus of a light source shifts to the plus side in an exposure step in the formation of an ultrafine resist pattern of not more than 0.35 μm (FIG. 5), and hence the composition has narrow focal depth range and has disadvantageous as in Japanese Patent Laid-Open No. 6-167805 mentioned above.

Furthermore, Japanese Patent Laid-Open No. 63-115162 mentions a positive photoresist composition having improved film residual rate after development, which is obtained by using a quinonediazide ester of the specific compound which is disclosed in the present invention as a compound of the formula (IIIa). The composition is inferior in definition and cannot form a pattern having satisfactory underexposure margin and focal depth range properties in the formation of an ultra fine pattern of not more than 0.35 μm.

Japanese Patent Laid-Open No. 60-121445 also discloses a positive photoresist composition using, as a photosensitizer, a quinonediazide ester of a compound, which is disclosed as the compound of the formula (IVa) in the present invention. The composition is inferior in definition and cannot form a pattern having satisfactory underexposure margin and focal depth range properties in the formation of an ultrafine pattern of not more than 0.35 μm.

SUMMARY OF THE INVENTION

Accordingly, it is an object of the present invention to provide a positive photoresist composition which exhibits high sensitivity and high definition and improved focal depth range properties and underexposure margin.

After intensive investigations, the present inventors have solved the above problems.

To be more specific, the invention provides a positive photoresist composition including (A) an alkali-soluble resin and (B) a photosensitizer, wherein Ingredient (B) comprises:

(B-1) a quinonediazide ester of at least one compound selected from compounds represented by the following formula (I) or (II):

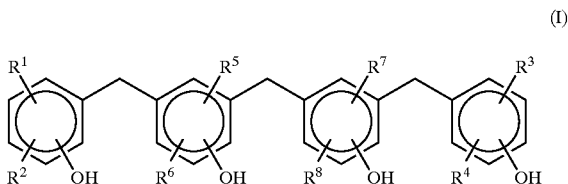

(I)

-continued

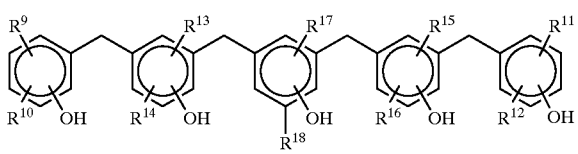

(II)

wherein each of $R^1$ through $R^{17}$ is independently a hydrogen atom or an alkyl group having 1 to 3 carbon atoms, and $R^{18}$ is an alkyl group having 1 to 3 carbon atoms or a cycloalkyl group, and (B-2) a quinonediazide ester of at least one compound selected from compounds represented by the following formula (III) or (IV):

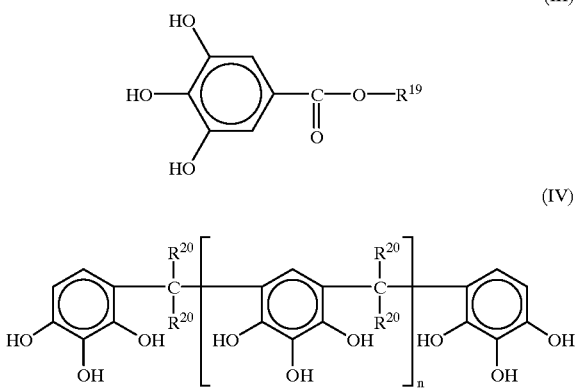

(III)

(IV)

wherein each of $R^{19}$ and $R^{20}$ is independently an alkyl group having 1 to 5 carbon atoms and n denotes 0 or an integer of 1 to 8.

Ingredient (B-1) in the composition may preferably be a quinonediazide diester of a compound represented by the following formula (Ia):

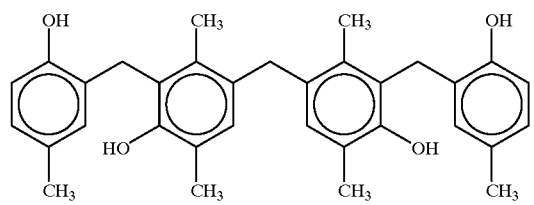

(Ia)

Ingredient (B-2) in the above composition may preferably be a quinonediazide triester of a compound of the following formula (IIIa):

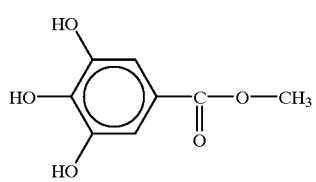

(IIIa)

In the positive photoresist composition, Ingredient (B-2) may preferably be a quinonediazide tetraester of a compound of the following formula (IVa):

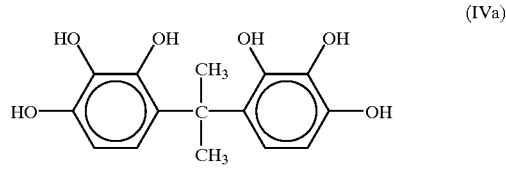

(IVa)

In the composition, Ingredient (B) may contain Ingredient (B-1) and Ingredient (B-2) in a total amount of 50% to 100% by weight and in a ratio such that Ingredient (B-1)/Ingredient (B-2) is 2 to 9 (by weight).

In the composition, Ingredient (B) may contain 5% to 30% by weight of at least one compound of quinonediazide diesters of compounds represented by the following formula (V):

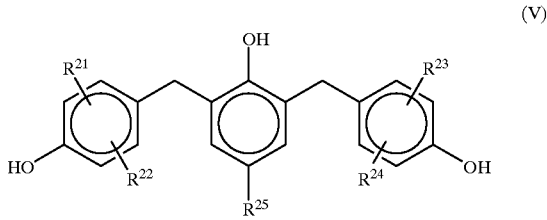

(V)

wherein each of $R^{21}$ through $R^{25}$ is independently an alkyl group having 1 to 3 carbon atoms.

The invention further provides a process for forming a resist pattern having a high underexposure margin Eop/Es, where the exposure to exactly reproduce a pattern in accordance with predetermined dimensions by a mask pattern at an illumination intensity at substrate of 500 mW/cm² is defined as the exposure Eop (ms) and the minimum exposure to give an isolated pattern at an illumination intensity at substrate of 500 mW/cm² is defined as the exposure (ms) Es, comprising the steps of coating a solution of the aforementioned positive photoresist composition onto a substrate, drying the coated substrate to form a photosensitive layer, exposing the photosensitive layer to UV light and developing it with a proper developer.

BRIEF DESCRIPTION OF THE DRAWINGS

These and other features, objects, and advantages of the present invention will become apparent upon a consideration of the following description of the invention when read in conjunction with the drawings, in which:

FIG. 1 illustrates the relationship between the underexposure margin and focal depth range when a composition according to Example 1 is used;

FIG. 2 illustrates the relationship between the underexposure margin and focal depth range when a composition according to Example 3 is used;

FIG. 3 illustrates the relationship between the underexposure margin and focal depth range when a composition according to Comparative Example 1 is used;

FIG. 4 illustrates the relationship between the underexposure margin and focal depth range when a composition according to Comparative Example 3 is used.

DETAILED DESCRIPTION OF THE INVENTION

(A) alkali-soluble Resin

Figure 5A:
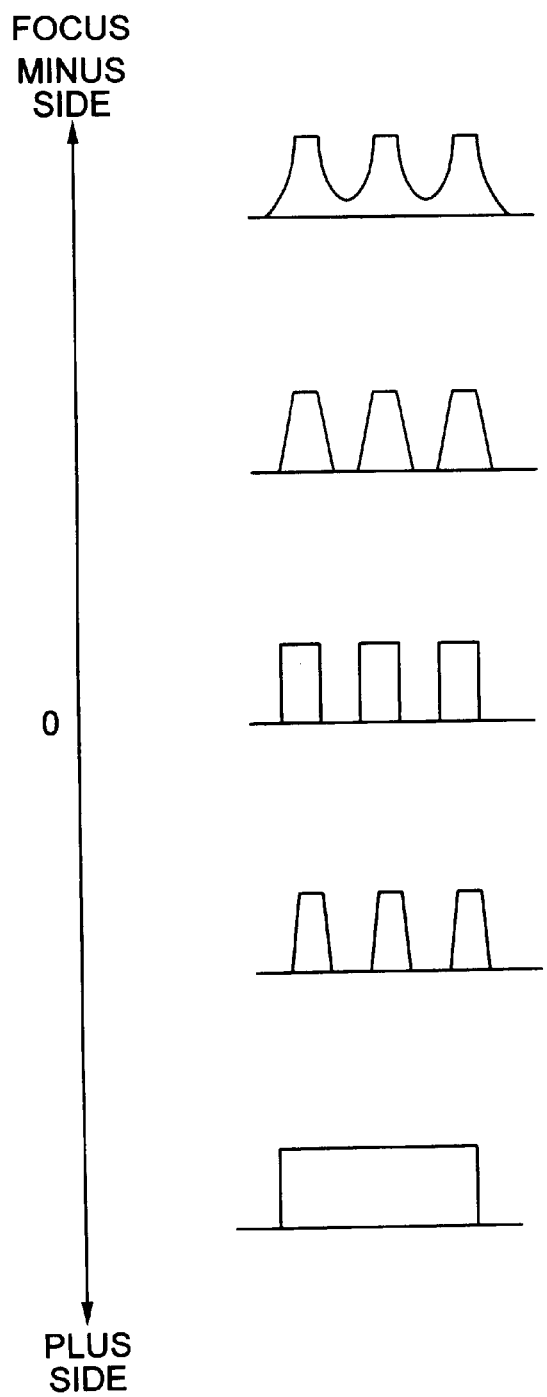
FIG. 5 illustrates changes of resist patterns with shifts of the focus when the conventional photosensitizers are employed.
Figure 5B:
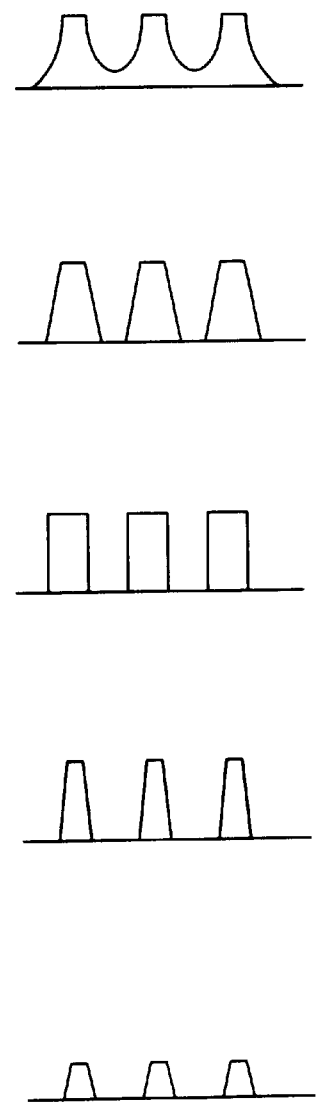

An alkali-soluble resin used as Ingredient (A) is not limited and can be liberally chosen from those generally used as film-forming substances in positive photoresist compositions.

Examples of such resins include condensates of aromatic hydroxyl compounds and aldehydes or ketones, polyhydroxystyrenes and their derivatives.

The aromatic hydroxyl compounds include, for example, phenol, m-cresol, p-cresol, o-cresol, 2,3-xylenol, 2,5-xylenol, 3,5-xylenol, 3,4-xylenol and other xylenols; m-ethylphenol, p-ethylphenol, o-ethylphenol, 2,3,5-trimethylphenol, 2,3,5-triethylphenol, 4-tert-butylphenol, 3-tert-butylphenol, 2-tert-butylphenol, 2-tert-butyl-4-methylphenol, 2-tert-butyl-5-methylphenol and other alkyl-substituted phenols; p-methoxyphenol, m-methoxyphenol, p-ethoxyphenol, m-ethoxyphenol, p-propoxyphenol, m-propoxyphenol and other alkoxy-substituted phenols; o-isopropenylphenol, p-isopropenylphenol, 2-methyl-4-isopropenylphenol, 2-ethyl-4-isopropenylphenol and other isopropenyl-substituted phenols; phenylphenol and other aryl-substituted phenols; 4,4'-dihydroxybiphenyl, bisphenol A, resorcinol, hydroquinone, pyrogallol and other polyhydroxy-substituted phenols. These aromatic hydroxyl compounds can be used singly or in combination.

As suitable examples of the aldehydes, there may be mentioned formaldehyde, paraformaldehyde, trioxane, acetaldehyde, propionaldehyde, butylaldehyde, trimethylacetaldehyde, acrolein (acrylaldehyde), crotonaldehyde, cyclohexanaldehyde, furfural, furylacrolein, benzaldehyde, terephthalaldehyde, phenylacetaldehyde, α-phenylpropylaldehyde, β-phenylpropylaldehyde, o-hydroxybenzaldehyde, m-hydroxybenzaldehyde, p-hydroxybenzaldehyde, o-methylbenzaldehyde, m-methylbenzaldehyde, p-methylbenzaldehyde, o-chlorobenzaldehyde, m-chlorobenzaldehyde, p-chlorobenzaldehyde, and cinnamaldehyde. Each of these aldehydes may be used independently or in combination.

Practical examples of the ketones include acetone, methyl ethyl ketone, diethyl ketone and diphenyl ketone. Each of these ketones may be used singly or in combination. Further, an optional combination of any of aldehydes and any of ketones can be employed.

The condensate of an aromatic hydroxyl compound and an aldehyde or a ketone can be prepared in the presence of an acidic catalyst according to a known technique. Such an acidic catalyst includes, for instance, hydrochloric acid, sulfuric acid, formic acid, oxalic acid and p-toluenesulfonic acid.

As examples of the polyhydroxystyrenes and their derivatives, there may be mentioned vinylphenol homopolymers, and copolymers of vinylphenol and a copolymerizable comonomer. Such a comonomer includes, for instance, acrylic acid derivatives, acrylonitrile, methacrylic acid derivatives, methacrylonitrile, styrene, α-methylstyrene, p-methylstyrene, o-methylstyrene, p-methoxystyrene, p-chlorostyrene and other styrene derivatives.

Of these alkali-soluble resins to be used in the present invention as Ingredient (A), novolak resins obtained from a phenol compound such as m-cresol, p-cresol, 2,5-xylenol, 3,5-xylenol, 2,3,5-trimethylphenol, and an aldehyde such as formaldehyde are advantageously used since they are effective in achieving high thermostability. Incidentally, low molecular weight fractions of the novolak resin have been removed. In particular, preferred are novolak resins containing 5% to 40% by mole of p-cresol, and, in addition, m-cresol and 2,5-xylenol as constitutive units and having an ortho-ortho bonding content of 20% to 80%.

The weight average molecular weight of the novolak resin may range from 2,000 to 25,000, preferably from 2,500 to 20,000 and more preferably from 5,000 to 10,000, and preferably the resin comprise no low molecular weight fraction. The term "weight average molecular weight" as used herein is defined as the value in terms of polystyrene measured by gel permeation chromatography (GPC).

The removal of low molecular weight fractions can be conducted by fractionation or other treatments. The fractionation is carried out by, for example, a process of dissolving a resin obtained by condensation in a good solvent and adding the resultant solution into water to thereby form precipitates. The good solvent includes, for instance, methanol, ethanol and other alcohols, acetone, methyl ethyl ketone and other ketones, ethylene glycol monoethyl ether acetate, and tetrahydrofuran.

(B) Quinonediazide Ester

Ingredient (B) of the composition of the invention comprises Ingredient (B-1) including a quinonediazide ester of a compound represented by the formula (I) and/or (II), and Ingredient (B-2) including a quinonediazide ester of a compound represented by the formula (III) and/or (IV). Each of the ingredients will now be described below.

Ingredient (B-1)

Preferred examples of the compounds represented by the formula (I) include:

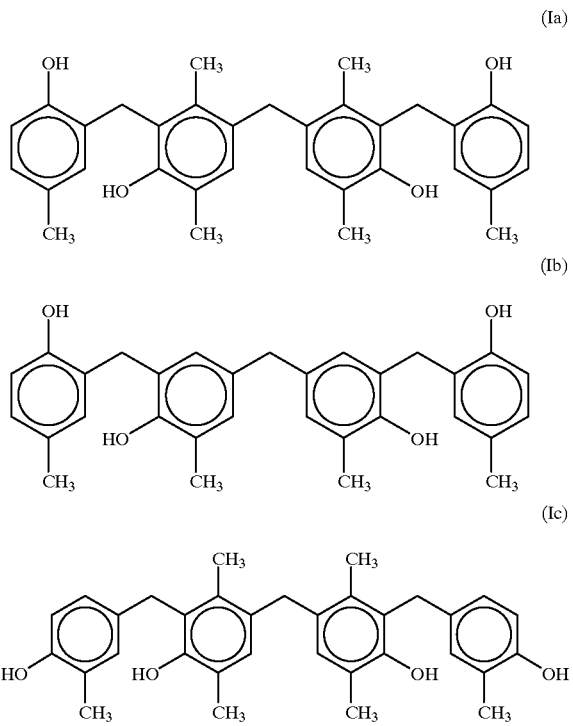

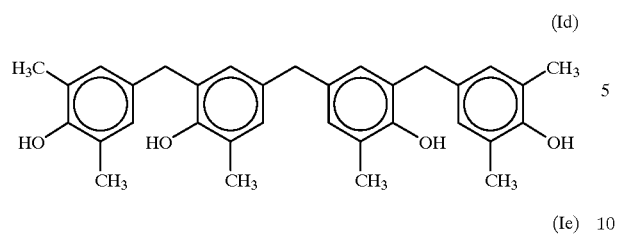
(Id)
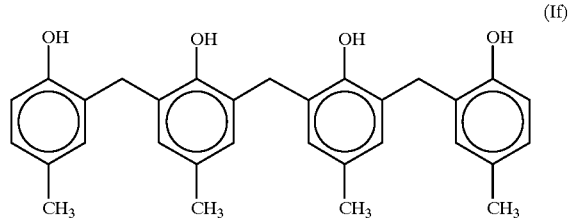
(If)
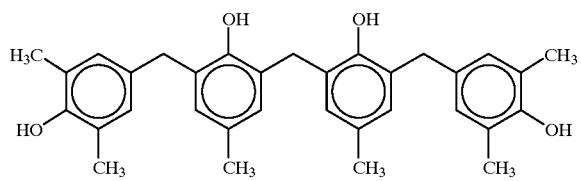
(Ie)
Of these compounds, bis[2,5-dimnethyl-3-(2-hydroxy-5-methylbenzyl)-4-hydroxyphenyl]methane represented by the formula (Ia) is advantageous for providing high definition.
As practical examples of the compounds represented by the formula (II), there may be mentioned:
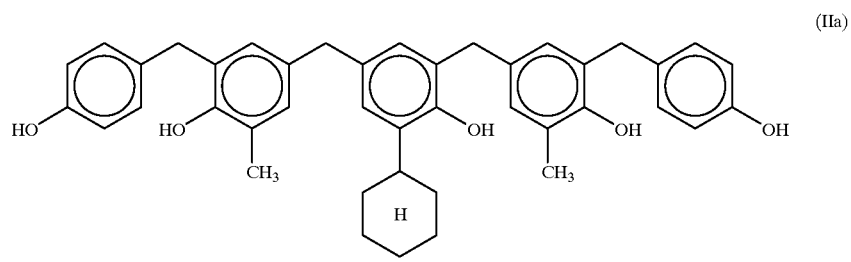
(IIa)
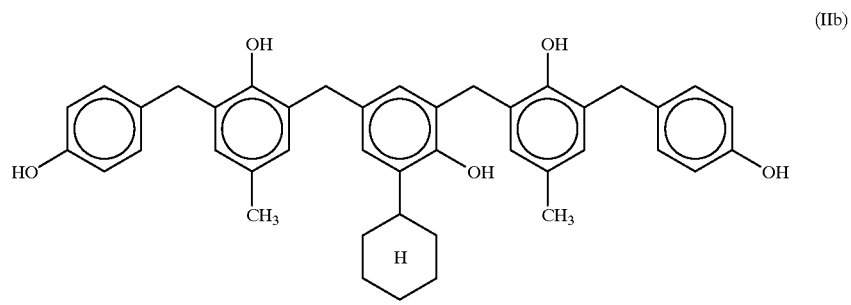
(IIb)
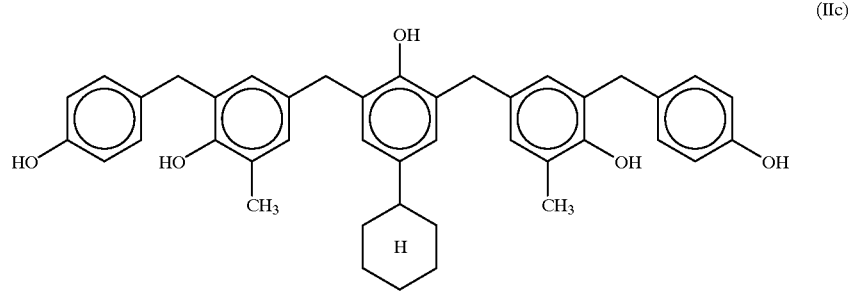
(IIc)
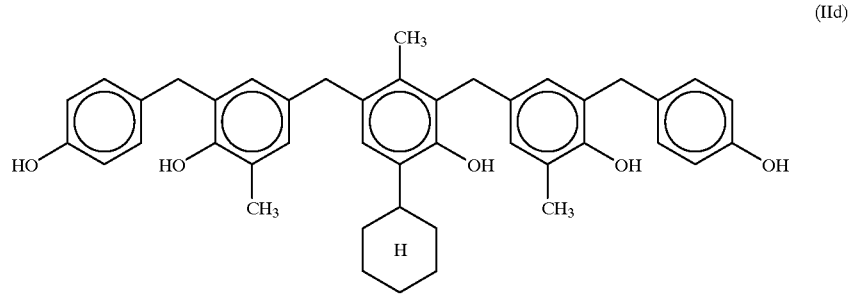
(IId)

-continued

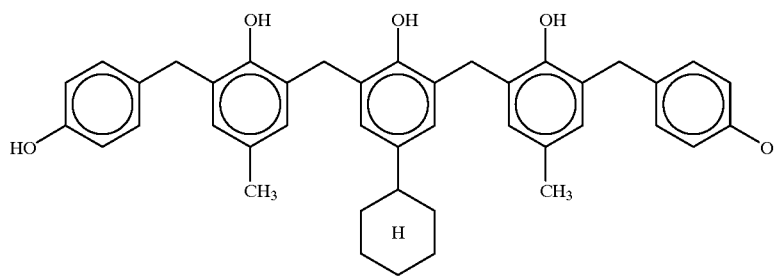

(IIe)

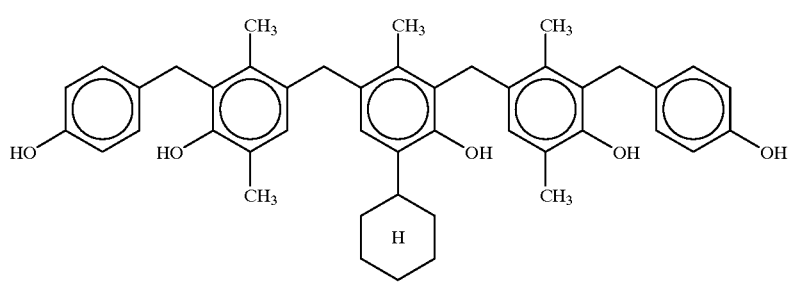

(IIf)

Of these compounds, 2,4-bis[4-hydroxy-3-(4-hydroxybenzyl) 5-methylbenzyl]-6-cyclohexylphenol represented by the formula (IIa) is advantageously used for providing high definition.

The quinonediazide ester of the compound of the formula (I) preferably has an average esterification rate of 50%, that is, it is preferably diester-rich. When it is monoester-rich, the film residual rate and definition are deteriorated, and when it is triester- or tetraester-rich, the sensitivity remarkably decreases and development residue (scum) increases. The term "diester-rich" used herein means that the peak area ratio of a diester determined at 254 nm by high performance liquid chromatography is relatively larger than any peak area ratios of other mono-, tri- and tetra-esters. Mono-, tri-, tetra-esters may be formed to some extent through the esterification, and these esters can be present in Ingredient (B-1).

On the contrary, the quinonediazide ester of the compound of the formula (II) preferably has an average esterification rate of 60%, in other words, it is preferably triester-rich. When it is monoester- or diester-rich, the film residual rate and definition are deteriorated, and when it is tetraester- or pentaester-rich, the sensitivity remarkably decreases and development residue (scum) increases. The term "triester-rich" used herein means the peak area ratio of a triester is relatively larger than any peak area ratios of other mono-, di- and tetra-esters. Mono-, di-, tetra- or penta-esters may be formed to some extent through the esterification, and these esters can be present in Ingredient (B-1).

Ingredient (B-2)

Quinonediazide esters of the compounds of the formula (III) and (IV) are advantageous for improving underexposure margin and the pattern forming properties when the focus of a light source in the exposure step shifts to the plus side. The compounds of the formula (III) include methyl gallate, ethyl gallate, propyl gallate, butyl gallate and pentyl gallate, among which methyl gallate is typically preferred for the improvement of the pattern forming properties when the focus shifts to the plus side.

As the compounds of the formula (IV), there may be mentioned, for example, 2,2-bis(2,3,4-trihydroxyphenyl) propane, 3,3-bis(2,3,4-trihydroxyphenyl)pentane, 4,4-bis(2,3,4-trihydroxyphenyl)heptane, a condensate of pyrogallol and acetone. Of these compounds, 2,2-bis(2,3,4-trihydroxyphenyl)propane is typically preferred for the improvement of the pattern forming properties when the focus shifts to the plus side.

The quinonediazide ester of the compound of the formula (III) preferably has an esterification rate of 100%, that is, the ester is preferably triester-rich. When it is monoester- or diester-rich, the film residual rate and definition are markedly decreased, and the focal depth range properties and underexposure margin are deteriorated. A little amount of mono- or di-esters may be formed through the esterification and these esters can be present in Ingredient (B-2).

The quinonediazide ester of the compound of the formula (IV) preferably has an average esterification rate of 67% when n is 0, i.e., the ester is preferably tetraester-rich. When it is mono-, di-, or tri-ester rich, the film residual rate and definition are decreased and the focal depth range properties and underexposure margin are deteriorated. On the contrary, when it is penta- or hexa-ester rich, the sensitivity markedly decreases and the development residue (scum) increases. Mono-, di-, tri-g penta- and hexa-esters may be formed in little amounts through the esterification, and these esters can be present in Ingredient (B-2).

When n is an integer of 1 to 8, the ester may preferably be obtained by reacting a corresponding compound with (n+2) moles of a quinonediazidesulfonyl halide.

The ratio of Ingredient (B-1) relative to Ingredient (B-2) in the photosensitizer (B) may preferably fall in the range from 2 to 9 (by weight), and particularly from 3 to 8 (by weight). Within this range, the definition, focal depth range properties and underexposure margin can more satisfactorily be improved.

The total content of Ingredients (B-1) and (B-2) in the photosensitizer (B) may preferably fall in the range from 50% to 100% by weight and more preferably from 60% to 80% by weight.

Within this range, the definition, focal depth range properties and underexposure margin can more satisfactorily be improved.

The photosensitizer (B) may further comprise, in addition to the above quinonediazide esters, a quinonediazide diester of a compound represented by the following formula (V):

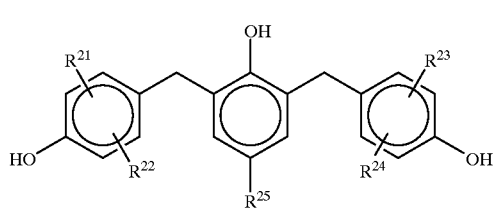
(V)

wherein each of $R^{21}$ through $R^{25}$ is independently an alkyl group having 1 to 3 carbon atoms. The use of this diester further improves the underexposure margin.

The compounds represented by the formula (V) include:

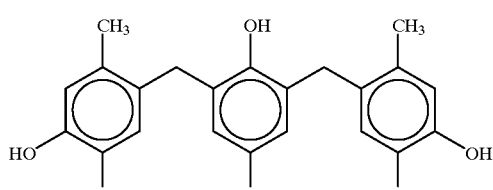
(Va)

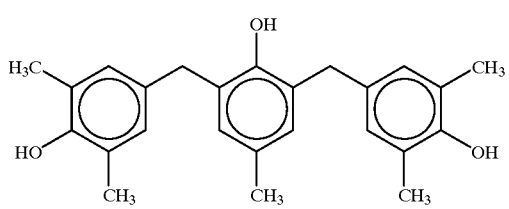
(Vb)

A quinonediazide diester of the compound of the formula (V) may preferably be added in an amount of 5% to 30% by weight, more preferably from 10% to 20% by weight in the photosensitizer (B). Within this range, the high definition of the positive photoresist composition of the invention is not adversely affected and the underexposure margin is markedly improved.

The photosensitizer (B) in the composition of the invention comprises esters between of the hydroxyl compounds as mentioned above and quinonediazide compounds. The quinonediazide compounds include, for example, naphthoquinone-1,2-diazidesulfonyl halides, o-benzoquinonediazidesulfonyl halides, and o-anthraquinonediazidesulfonyl halides. Of these compounds, naphthoquinone-1,2-diazide-5-sulfonyl chloride and naphthoquinone-1,2-diazide-4-sulfonyl chloride are preferred. The esterification can be conducted according to a conventional technique.

Incidentally, a quinonediazide ester other than the above esters can be used additionally as the photosensitizer (B).

The amount of Ingredient (B) in the composition of the invention may preferably fall in the range from 10% to 60% by weight and more preferably from 20% to 50% by weight relative to the total amount of Ingredient (A), alkali-soluble resin, and Ingredient (C) added according to necessity. When the content of Ingredient (B) is less than the above range, images in exact accordance with a pattern cannot be obtained and transfer properties are deteriorated. When it exceeds the above range, the sensitivity and uniformity of a formed resist film are decreased, and the definition is deteriorated.

(C) Sensitizer

The composition may further comprise (C) a sensitizer (sense amplifier) where necessary. Any known sensitizers can be used liberally as the sensitizer (C). Such sensitizers include the compounds represented by the formulae (I), (II), (III) and (IV) and other compounds. As practical examples of the sensitizers, there may be mentioned bis(4-hydroxy-2,3,5-trimethylphenyl)-2-hydroxyphenylmethane, 1,4-bis[1-(3,5-dimethyl-4-hydroxyphenyl)isopropyl]benzene, 2,4-bis(3,5-dimethyl-4-hydroxyphenylmethyl)-6-methylphenol, bis(4-hydroxy-3,5-dimethylphenyl)-2-hydroxyphenylmethane, bis(4-hydroxy-2,5-dimethylphenyl)-2-hydroxyphenylmethane, bis(4-hydroxy-3,5-dimethylphenyl)-3,4-dihydroxyphenylmethane, 1-[1-(4-hydroxyphenyl)isopropyl]-4-[1,1-bis(4-hydroxyphenyl)ethyl]benzene, 1-[1-(3-methyl-4-hydroxyphenyl)isopropyl]-4-[1,1-bis(3-methyl-4-hydroxyphenyl)ethyl]benzene, 2,6-bis[1-(2,4-dihydroxyphenyl)isopropyl]-4-methylphenol, 4,6-bis[1-(4-hydroxyphenyl)isopropyl]resorcin, 4,6-bis(3,5-dimethoxy-4-hydroxyphenylmethyl)pyrogallol, 4,6-bis(3,5-dimethyl-4-hydroxyphenylmethyl)pyrogallol, 2,6-bis(3-methyl-4,6-dihydroxyphenylmethyl)-4-methylphenol, 2,6-bis(2,3,4-trihydroxyphenylmethyl)-4-methylphenol and 1,1-bis(4-hydroxyphenyl)cyclohexane.

Of these compounds, the composition preferably comprises at least one compound selected from the following compounds as Ingredient (C):

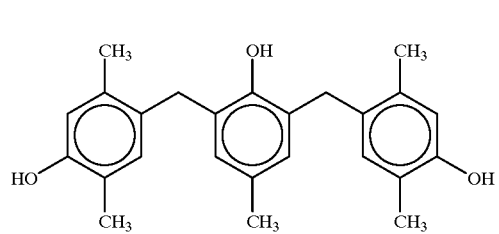
(C1)

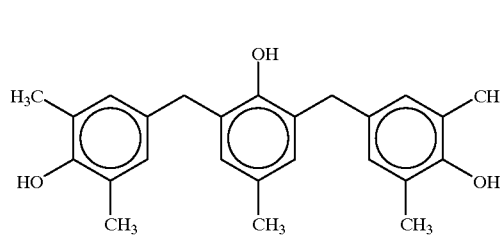
(C2)

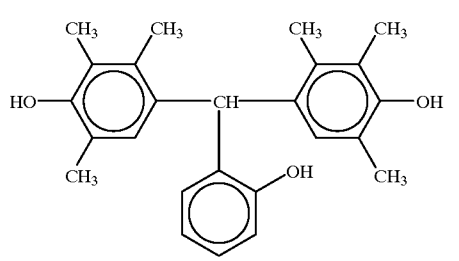
(C3)

The content of Ingredient (C), if added, may fall in the range from 5% to 50% by weight, and preferably from 10% to 35% by weight relative to the alkali-soluble resin, Ingredient (A).

Where necessary, the composition may further comprise any of compatible additives including, for example, ultraviolet absorbents for inhibition of halation and surfactants for prevention of striation within a range not adversely affecting the objects of the invention. Examples of the ultraviolet absorbents include 2,2',4,4'-tetrahydroxybenzophenone, 4-dimethylamino-2',4'-dihydroxybenzophenone, 5-amino-3-methyl-1-phenyl-4-(4-hydroxyphenylazo)pyrazole, 4-dimethylamino-4'-hydroxyazobenzene, 4-diethylamino-4'-ethoxyazobenzene, 4-diethylaminoazobenzene and curcumin. As the surfactants, there may be mentioned, for instance, Fluorade FC-430 and FC-431 (trade names, manufactured by Sumitomo 3M Ltd., Japan), F-TOP EF122A, EF122B, EF122C and EF126 (trade names, manufactured by Tochem Products Ltd., Japan) and other fluorine-containing surfactants.

The composition of the invention may preferably be used as a solution obtained by dissolving Ingredients (A) and (B), and each of ingredients added according to necessity such as Ingredient (C), in a proper solvent.

Practical examples of the solvent include solvents conventionally used for positive photoresist compositions, such as acetone, methyl ethyl ketone, cyclohexanone, methyl isoamyl ketone, 2-heptanone and other ketones; ethylene glycol, propylene glycol, diethylene glycol, ethylene glycol monoacetate, propylene glycol monoacetate, diethylene glycol monoacetate, or their monomethyl ethers, monoethyl ethers, monopropyl ethers, monobutyl ethers or monophenyl ethers and other polyhydric alcohols and their derivatives; dioxane and other cyclic ethers; and ethyl lactate, methyl acetate, ethyl acetate, butyl acetate, methyl pyruvate, ethyl pyruvate, methyl methoxypropionate, ethyl ethoxypropionate and other esters. Each of these solvents may be used solely or in combination. In particular, acetone, methyl ethyl ketone, cyclohexanone, methyl isoamyl ketone, 2-heptanone and other ketones; ethyl lactate, methyl acetate, ethyl acetate, butyl acetate, methyl pyruvate, ethyl pyruvate, methyl methoxypropionate, ethyl ethoxypropionate and other esters are desirable.

Practically, the composition may be used, for example, in the following manner: Each of the ingredients of the composition is dissolved in a proper solvent as mentioned above to give a coating solution; the coating solution is then applied, using a spinner, onto a substrate such as a silicon wafer, and subsequently dried to form a photosensitive layer; next, the photosensitive layer is irradiated and exposed with an ultraviolet ray source such as a low-pressure mercury lamp, a high-pressure mercury lamp, an ultra-high-pressure mercury lamp or a xenon lamp, through a desired mask pattern; and the exposed portions of the film are then dissolved and removed by dipping in a developer solution, for example, an alkaline aqueous solution such as a 1% to 10% by weight tetramethylammonium hydroxide (TMAH) aqueous solution, thus forming an image being in exact accordance with the mask pattern.

EXAMPLES

The present invention will be further illustrated in detail with reference to several inventive examples and comparative examples below.

Each of the characteristics of the positive photoresist compositions was evaluated according to the following manner, respectively.

(1) Sensitivity:

A sample was applied onto a silicon wafer using a spinner, and dried on a hot plate at 90° C. for 90 sec. to form a resist film having a thickness of 1.05 $\mu$m. The resist film was then irradiated through a mask (reticle) corresponding to a 0.35-$\mu$m resist pattern with line and space (L&S) of 1:1 at an illumination intensity at substrate of 500 mW/cm$^2$ for an increasing period from 0.1 sec. at intervals of 0.01 sec., using a reducing-type projection aligner NSR-2005i10 D (manufactured by Nikon Corporation, Japan; NA=0.57). The film was then post-exposure baked (PEB) at 110° C. for 90 sec.; subjected to developing in a 2.38% by weight tetramethylammonium hydroxide (TMAH) aqueous solution at 23° C. for 60 sec., washed with water for 30 sec., and dried. In this procedure, the sensitivity was defined as the optimum exposure time period (Eop) (ms) to give a 0.35-$\mu$m resist pattern with line and space width of 1:1.

(2) Underexposure Margin

A sample was applied onto a silicon wafer using a spinner, and dried on a hot plate at 90° C. for 90 sec. to form a resist film having a thickness of 1.05 $\mu$m. The resist film was then irradiated through a mask (reticle) corresponding to a 0.35-$\mu$m resist pattern with line and space (L&S) of 1:1 at an illumination intensity at substrate of 500 mW/cm$^2$ for an increasing period from 0.1 sec. at intervals of 0.01 sec., using a reducing-type projection aligner NSR-2005i10D (manufactured by Nikon Corporation, Japan; NA=0.57). The film was then post-exposure baked (PEB) at 110° C. for 90 sec.; subjected to developing in a 2.38% by weight tetramethylammonium hydroxide (TMAH) aqueous solution at 23° C. for 60 sec., washed with water for 30 sec., and dried. In this procedure, the underexposure margin was defined as Eop/Es, where the minimum exposure time period to obtain an isolated pattern after development was defined as Es (ms) and Eop was defined as above.

(3) Plus-Side Focal Depth Range Properties

The plus-side focal depth range was defined as the critical deviation ($\mu$m) to form a 0.35-$\mu$m resist pattern with line and space of 1:1 within a variation of ±10% of the predetermined dimensions when the focus was shifted to the plus side (to the substrate side) at the optimum exposure Eop.

(4) Definition

The definition was defined as the critical definition at an exposure which reproduced a 0.35-$\mu$m mask pattern.

Example 1

Ingredient (A):

Alkali-soluble novolak resin: 100 parts by weight [a resin composed of m-cresol:p-cresol:2,5-xylenol=5:1:4 (by mole) whose low molecular weight fractions were removed (Mw=6800, ortho-ortho bonding content 45%)]

Ingredient (B):

b1:b2=7:1 (by weight): 57 parts by weight [b1: diester-rich ester of bis[2,5-dimethyl-3-(2-hydroxy-5-methylbenzyl)-4-hydroxyphenyl]methane (compound of the formula (Ia)), b2: triester-rich ester of methyl gallate]

The term "ester" used herein means an ester of each of the aforementioned compounds and naphthoquinone-1,2-diazide-5-sulfonly chloride.

Ingredient (C):

c1:c2=1:1 (by weight): 33 parts by weight [c1: 2,6-bis(2,5-dimethyl-4-hydroxybenzyl)-4-methylphenol (compound of the formula (c1), c2: 1,1-bis(4-hydroxyphenyl)cyclohexane]

A positive photoresist composition was obtained by dissolving the above Ingredients (A), (B) and (C) in 470 parts by weight of 2-heptanone, and filtering the solution with a membrane filter having a pore size of 0.2 μm.

Examples 2 to 11 and Comparative Examples 1 to 3

A series of positive photoresist compositions were prepared in a similar manner as in Example 1, except that Ingredient (B) in Example 1 was changed to those indicated in Table 1 below.

TABLE 1

| Example | Ingredient (B) (ratio by weight) |
|---|---|
| 1 | b1:b2 = 7:1 |
| 2 | b1:b3 = 7:1 |
| 3 | b1:b2:b4 = 7:1:1 |
| 4 | b5:b2:b4 = 7:1:1 |
| 5 | b6:b2:b4 = 7:1:1 |
| 6 | b7:b2:b4 = 7:1:1 |
| 7 | b8:b2:b4 = 7:1:1 |
| 8 | b9:b2:b4 = 7:1:1 |
| 9 | b1:b2:b3 = 7:1:1 |
| 10 | b1:b2:b10 = 7:1:1 |
| 11 | b1:b2:b11 = 7:1:1 |
| Comp. Ex. 1 | b1 |
| Comp. Ex. 2 | b8 |
| Comp. Ex. 3 | b1:b' = 7:1 | b1: Diester-rich ester of the compound of the formula (Ia)
b2: Triester-rich ester of methyl gallate
b3: Tetraester-rich ester of the compound of the formula (IVa)
b4: Diester-rich ester of the compound of the formula (Va)
b5: Diester-rich ester of the compound of the formula (Id)
b6: Diester-rich ester of the compound of the formula (Ie)
b7: Diester-rich ester of the compound of the formula (Ib)
b8: Diester-rich ester of the compound of the formula (Ic)
b9: Triester-rich ester of the compound of the formula (IIa)
b10: Diester-rich ester of the compound of the formula (Vb)
b11: Diester-rich ester of the compound of the following formula:

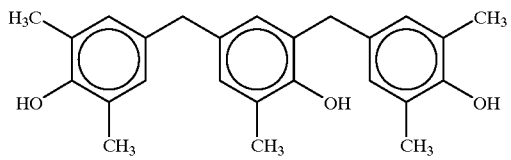

b': Tetraester-rich ester of the compound of the following formula:

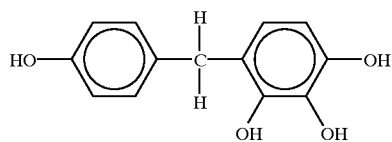

Table 2 demonstrates the characteristics (1) through (4) of the compositions prepared in Examples 1 to 11 and Comparative Examples 1 to 3.

TABLE 2

| Ex. | Sensitivity (ms) | Underexposure Margin (Eop/Es) | Plus-side Focal Depth Range (μm) | Definition (μm) |
|---|---|---|---|---|
| 1 | 475 | 1.28 | 0.6 | 0.30 |
| 2 | 470 | 1.37 | 0.6 | 0.30 |
| 3 | 520 | 1.35 | 0.6 | 0.28 |

TABLE 2-continued

| Ex. | Sensitivity (ms) | Underexposure Margin (Eop/Es) | Plus-side Focal Depth Range (μm) | Definition (μm) |
|---|---|---|---|---|
| 4 | 535 | 1.34 | 0.5 | 0.28 |
| 5 | 535 | 1.34 | 0.5 | 0.26 |
| 6 | 520 | 1.35 | 0.6 | 0.28 |
| 7 | 560 | 1.33 | 0.6 | 0.26 |
| 8 | 580 | 1.35 | 0.6 | 0.28 |
| 9 | 475 | 1.34 | 0.6 | 0.28 |
| 10 | 510 | 1.33 | 0.6 | 0.28 |
| 11 | 510 | 1.33 | 0.6 | 0.28 |
| Comp. Ex. 1 | 475 | 1.14 | 0.4 | 0.30 |
| Comp. Ex. 2 | 505 | 1.13 | 0.4 | 0.30 |
| Comp. Ex. 3 | 460 | 1.15 | 0.4 | 0.32 |

FIGS. 1 through 4 demonstrate the relationship between the underexposure margin and focal depth range(process windows) respectively on the compositions according to Example 1, Example 3, Comparative Example 1 and Comparative Example 3.

In FIGS. 1 through 4, the row indicates the exposure time period (ms) and the column indicates the focal depth range (μm). The diagonally shaded areas indicate areas where the patterns were formed within a range of ±10% of the predetermined dimensions (0.35-μm pattern with line and space of 1:1). FIG. 1 demonstrates that the composition according to Example 1 gave. a pattern having satisfactory focal depth range and having dimensions near to the predetermined dimensions at Eop of 475 ms even when the focus shifted to the plus side or minus side; and that the margin was large even at a short exposure time period, i.e., in underexposure. FIG. 2 demonstrates that Example 3 exhibited similar results. On the contrary, FIG. 3 for Comparative Example 1 and FIG. 4 for Comparative Example 3 demonstrate that these comparative examples were inferior in the focal depth range properties and underexposure margin to Example 1 shown in FIG. 1.

The present invention can provide a positive photoresist composition exhibiting high sensitivity and definition, and improved focal depth range properties and underexposure margin.

While the invention has been described in detail and with reference to specific embodiments thereof, it will be apparent to one of ordinary skill in the art that various changes and modifications can be made therein without departing from the spirit and scope thereof.

What is claimed is:

1. A positive photoresist composition comprising (A) novolak resins containing p-cresol, m-cresol and 2,5-xylenol as constitutive units and having an ortho-ortho bonding content of 20% to 80% and (B) a photosensitizer, wherein said Ingredient (B) comprises:

(B-1) a quinonediazide ester of

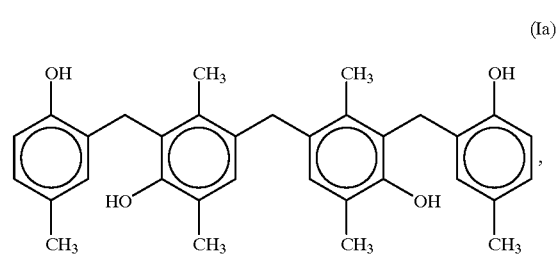

(Ia)

and (B-2) a quinonediazide ester of at least one compound selected from compounds represented by the following formula (III) and (IV):

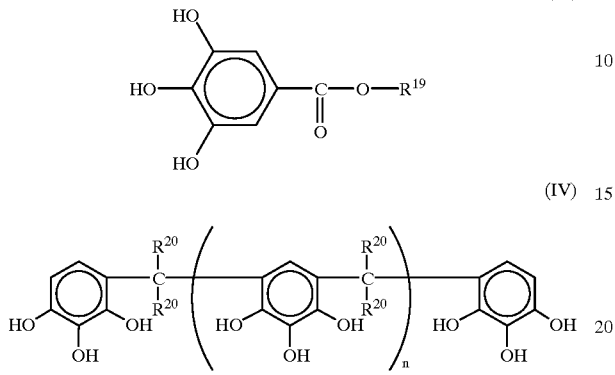

wherein each of $R^{19}$ and $R^{20}$ is independently an alkyl group having 1 to 5 carbon atoms, and n denotes 0 or an integer of 1 to 8.

2. The composition according to claim 1, wherein Ingredient (B-2) is a quinonediazide triester of a compound represented by the following formula (IIIa):

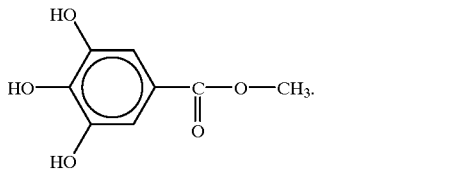

3. The composition according to claim 1, wherein Ingredient (B-2) is a quinonediazide tetraester of a compound represented by the following formula (IVa):

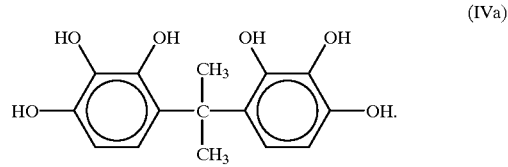

4. The composition according to claim 1, wherein Ingredient (B) comprises Ingredient (B-1) and Ingredient (B-2) in a total amount of 50% to 100% by weight and in a ratio such that Ingredient (B-1)/Ingredient (B-2) is 2 to 9 (by weight).

5. The composition according to claim 1, wherein Ingredient (B) comprises 5% to 30% by weight of at least one compound selected from quinonediazide diesters of compounds represented by the following formula (V):

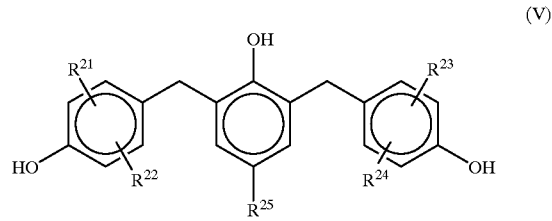

wherein each of $R^{21}$, $R^{22}$, $R^{23}$, $R^{24}$ and $R^{25}$ is independently an alkyl group having 1 to 3 carbon atoms.

6. A process for forming a resist pattern having a high underexposure margin Eop/Es, where the exposure to exactly reproduce a pattern in accordance with predetermined dimensions by a mask pattern at an illumination intensity at substrate of 500 mW/cm$^2$ is defined as the exposure Eop (ms) and the minimum exposure to give an isolated pattern at an illumination intensity at substrate of 500 mW/cm$^2$ is defined as the exposure Es (ms), comprising the steps of coating a solution of the positive photoresist composition according to claim 1 onto a substrate, drying the coated substrate to form a photosensitive layer, exposing the photosensitive layer to light and developing it with a proper developer.

* * * * *